(12) United States Patent
Das et al.

(10) Patent No.: US 6,334,907 B1
(45) Date of Patent: *Jan. 1, 2002

(54) METHOD OF CONTROLLING THICKNESS AND ALUMINUM CONTENT OF A DIFFUSION ALUMINIDE COATING

(75) Inventors: Nripendra N. Das, West Chester; Thomas E. Mantkowski, Madeira; Jeffrey A. Conner, Hamilton, all of OH (US)

(73) Assignee: General Electric Company, Cincinnati, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/417,468

(22) Filed: Oct. 13, 1999

Related U.S. Application Data

(60) Provisional application No. 60/141,659, filed on Jun. 30, 1999.

(51) Int. Cl.[7] .................................................. C23C 8/00
(52) U.S. Cl. ....................... 148/280; 148/283; 427/253
(58) Field of Search ................................. 148/240, 280, 148/283; 427/252, 253

(56) References Cited

U.S. PATENT DOCUMENTS 5,368,888 A * 11/1994 Rigney ....................... 427/253

FOREIGN PATENT DOCUMENTS

| EP | 0731187 A1 | 9/1986 |
| EP | 0933448 A1 | 1/1994 |

* cited by examiner

Primary Examiner—John Sheehan
Assistant Examiner—Andrew L. Oltmans
(74) Attorney, Agent, or Firm—Andrew C. Hess; David L. Narciso

(57) ABSTRACT

A process for forming a diffusion aluminide coating on a substrate, such as a component for a gas turbine engine. The process generally entails placing the substrate in a suitable coating chamber, flowing an inert or reducing gas into and through the coating chamber, and then aluminizing the substrate using an aluminizing technique with a substantially constant aluminum activity, such as a vapor phase deposition process. During the aluminizing process, the amount of unreacted aluminum within the coating chamber is controlled by altering the flow rate of the gas through the coating chamber so that a portion of the unreacted aluminum is swept from the coating chamber by the gas. The amount of unreacted aluminum swept from the coating chamber is regulated by metering the gas flow rate in order to control the aluminizing rate and aluminum content of the resulting aluminide coating.

13 Claims, 1 Drawing Sheet

METHOD OF CONTROLLING THICKNESS AND ALUMINUM CONTENT OF A DIFFUSION ALUMINIDE COATING

This appln claims benefit of provisional appln 60/141,059 filed Jun. 30, 1999.

FIELD OF THE INVENTION

The present invention relates to processes for forming protective diffusion aluminide coatings. More particularly, this invention relates to a process for controlling the thickness and aluminum content of a diffusion aluminide coating by controlling aluminum activity during the coating process.

BACKGROUND OF THE INVENTION

The operating environment within a gas turbine engine is both thermally and chemically hostile. Significant advances in high temperature capabilities have been achieved through the development of iron, nickel and cobalt-base superalloys and the use of oxidation-resistant environmental coatings capable of protecting superalloys from oxidation, hot corrosion, etc.

Diffusion aluminide coatings have particularly found widespread use for superalloy components of gas turbine engines. These coatings are generally formed by such methods as diffusing aluminum deposited by chemical vapor deposition (CVD) or slurry coating, or by a diffusion process such as pack cementation, above-pack, or vapor (gas) phase deposition. As depicted in FIG. 1, a diffusion aluminide coating 12 generally has two distinct zones, the outermost of which is an additive layer 16 containing an environmentally-resistant intermetallic represented by MAl, where M is iron, nickel or cobalt, depending on the substrate material. The MAl intermetallic is the result of deposited aluminum and an outward diffusion of iron, nickel or cobalt from the substrate 10. Beneath the additive layer 16 is a diffusion zone 14 comprising various intermetallic and metastable phases that form during the coating reaction as a result of diffusional gradients and changes in elemental solubility in the local region of the substrate 10. During high temperature exposure in air, the additive layer 16 forms a protective aluminum oxide (alumina) scale or layer (not shown) that inhibits oxidation of the diffusion coating 12 and the underlying substrate 10.

Diffusion processes generally entail reacting the surface of a component with an aluminum-containing gas composition. In pack cementation processes, the aluminum-containing gas composition is produced by heating a powder mixture of an aluminum-containing source (donor) material, a carrier (activator) such as an ammonium or alkali metal halide, and an inert filler such as calcined alumina. The ingredients of the powder mixture are mixed and then packed and pressed around the component to be treated, after which the component and powder mixture are heated to a temperature sufficient to vaporize and react the activator with the source material to form the volatile aluminum halide, which then reacts at the surface of the component to form the diffusion aluminide coating. Aluminum-containing source materials for vapor phase deposition processes can be aluminum alloy particles or an aluminum halide. If the source material is an aluminum halide, a separate activator is not required. The source material is placed out of contact with the surface to be aluminized. As with pack cementation, vapor phase aluminizing (VPA) is performed at a temperature at which the aluminum halide will react at the surface of the component to form a diffusion aluminide coating.

The rate at which a diffusion aluminide coating develops on a substrate is dependent on the aluminum activity of the process. Generally, CVD processes and those VPA processes where the source material is in the form of particles (e.g., chunks or pellets) with a fixed alloy composition have a constant aluminum activity as long as source material and sufficient activator are available. In contrast, aluminum activity decreases uncontrollably with time during pack cementation and other above-pack processes as a result of the reduced availability of the aluminum source material and/or activator over time. As a further complication, the rate at which the activator is depleted in pack cementation and above-pack processes increases with process-related anomalies, such as extended preheat times often required to heat the large mass of powder. As a result, aluminide coating thickness can be better controlled with VPA and CVD processes than pack cementation and above-pack processes. However, the aluminum content of the coating cannot be controlled to any certain degree during coating with existing aluminizing process.

In order to control both the final thickness and aluminum content of an aluminide coating, control of the aluminum activity during the diffusion process would be necessary. One advantage of being able to control coating thickness and aluminum content would be the ability to minimize coating growth and maximize environmental resistance by providing an outward-type aluminide coating characterized by a relatively low aluminum content near the original substrate surface, but a high aluminum content at the coating surface. Another advantage would be during the coating of a repaired component with both uncoated (e.g., new repair metal) and coated (e.g., unrepaired) surfaces, where additional coating on the original coating could lead to excessive coating thickness. However, as noted above, the prior art lacks a method by which aluminum activity can be accurately controlled during a diffusion aluminide coating process.

BRIEF SUMMARY OF THE INVENTION

The present invention generally provides a process for forming a diffusion aluminide coating on a substrate, such as a component for a gas turbine engine. The process generally entails placing the substrate in a suitable coating chamber, flowing an inert or reducing gas into and through the coating chamber, and then aluminizing the substrate using an aluminizing technique with a substantially constant aluminum activity, such as a vapor phase deposition process. During the aluminizing process, the amount of unreacted aluminum within the coating chamber is controlled by altering the flow rate of the gas through the coating chamber so that a portion of the unreacted aluminum is swept from the coating chamber by the gas. As a result, greater amounts of unreacted aluminum are swept from the coating chamber with higher gas flow rates, reducing the aluminizing rate and aluminum content of the resulting aluminide coating. In contrast, lower flow rates sweep lesser amounts of unreacted aluminum from the coating chamber, allowing for increased aluminizing rates and higher aluminum contents within the aluminide coating being formed.

In view of the above, the process of this invention is able to produce a diffusion aluminide coating whose thickness can be accurately controlled, as well as its aluminum content through the coating thickness. As a result, a diffusion aluminide coating can be produced whose thickness and aluminum content can be tailored for a particular application. For example, a coating can be produced to exhibit a reduced rate of coating growth and improved environmental resistance as a result of being initially deposited to be an outward-type aluminide coating characterized by a relatively low aluminum content near the original substrate surface, and with an increasing aluminum content toward the coating surface.

Also possible with this invention is the ability to rejuvenate a diffusion aluminide coating on a component, such as a component that has undergone surface repairs. In such circumstances, the aluminum activity is adjusted to such a range that diffusion of aluminum into the substrate is the rate controlling step for coating growth. On those uncoated (e.g., repaired) surfaces of the component, the driving force for coating growth is significant since the aluminum level is controlled by alloy chemistry. For those surfaces of the component that retain the original aluminide coating, the driving force for aluminum deposition is a function of the aluminum level remaining in the coating. Areas with significant aluminum levels in the existing coating will have minimal coating growth, while areas with existing coating that is depleted in aluminum will increase in aluminum content with slight coating growth. As a result, excessive coating thickness is avoided on those surfaces with the original coating.

In addition to the above advantages, the present invention provides a cost effective aluminizing method that is compatible with existing aluminizing processes and equipment. In addition, the method can be selectively implemented without interfering with the process flow of other components that do not require the benefits of this invention.

Other objects and advantages of this invention will be better appreciated from the following detailed description.

DETAILED DESCRIPTION OF THE INVENTION

Figure 1:
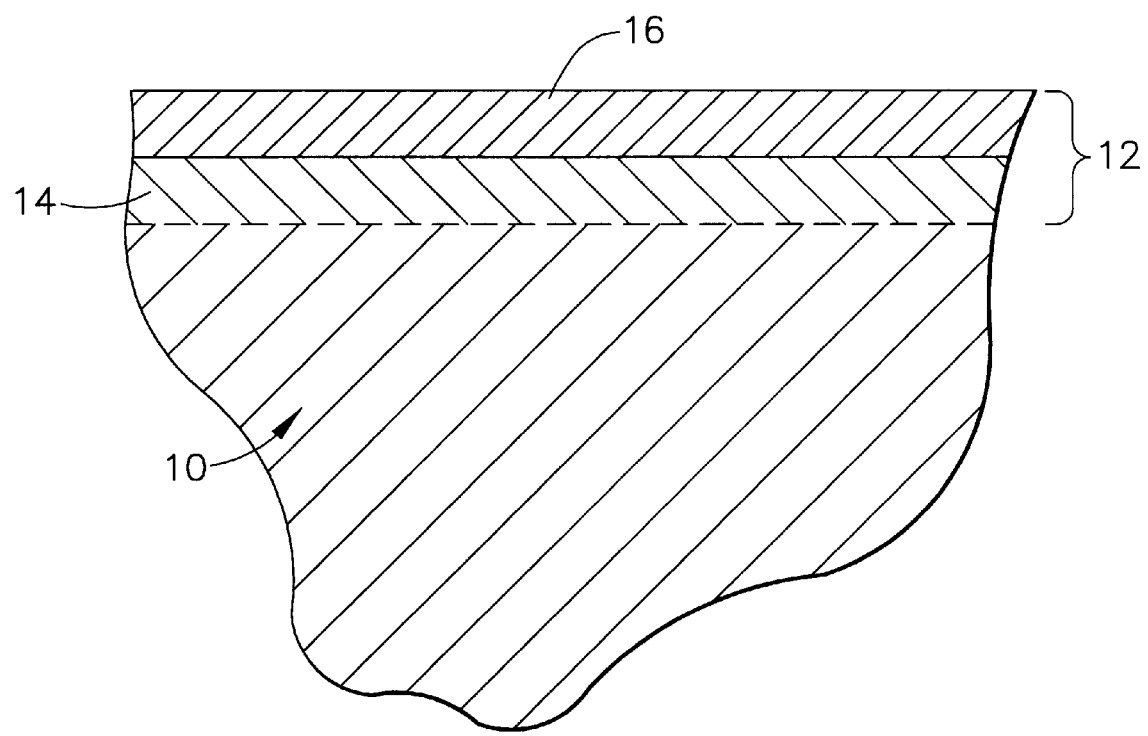
FIG. 1 is a cross-sectional view of a substrate with an outward-type diffusion aluminide coating.

The present invention is generally applicable to components that operate within thermally and chemically hostile environments, and are therefore subjected to oxidation and hot corrosion. Notable examples of such components include the high and low pressure turbine nozzles, blades and shrouds of gas turbine engines. While the advantages of this invention will be described with reference to gas turbine engine hardware, the teachings of the invention are generally applicable to any component on which an aluminide coating may be used to protect the component from its environment.

FIG. 1 represents an outward-type diffusion aluminide coating 12 that can be produced by the method of this invention. The coating 12 is shown as overlying a substrate 10, which is typically the base material of the component protected by the coating 12. Typical materials for the substrate 10 (and therefore the component) include nickel, iron and cobalt-base superalloys, though other alloys could be used. The aluminide coating 12 is generally characterized by an additive layer 16 that overlies a diffusion zone 14, the former of which contains an oxidation-resistant MAl intermetallic phase, such as the nickel-aluminide beta phase (NiAl). The additive layer 16 may also contain other intermetallic phases, depending on whether other metals were deposited or otherwise present on the substrate 10 prior to aluminizing. For example, the additive layer 16 may include $PtAl_2$ or platinum in solution in the MAl phase if platinum was plated on the substrate 10. An inward-type diffusion aluminide coating would generally differ from the outward-type coating 12 shown in FIG. 1 by having a thicker additive layer that primarily extends into and below the original substrate surface, but is otherwise compositionally similar. Diffusion aluminide coatings of both types form an aluminum oxide scale (not shown) on their surface during exposure to engine environments. The oxide scale inhibits oxidation of the aluminide coating 12 and substrate 10. A suitable thickness for the coating 12 is typically about 25 to 125 micrometers (about 0.001–0.005 inch).

According to this invention, the coating 12 is formed by an aluminizing technique characterized by a substantially constant aluminum activity. While vapor phase deposition will be described as being particularly well suited for use with this invention, it is foreseeable that other VPA processes that provide a substantially constant aluminum activity could be used or developed for use with the method of this invention.

Vapor phase deposition processes are well known in the art, and are conventionally carried out in an inert or reducing atmosphere within a coating chamber (retort) containing the component to be coated, an aluminum source (donor) material and one or more activators that, with the source material, generate the coating vapors (e.g., volatile aluminum halide) that react at the surface of the component to form the diffusion aluminide coating. However, with this invention, an inert gas such as argon or a reducing gas such as hydrogen is flowed through the chamber at a rate to alter the amount of unreacted aluminum in the chamber, such that the coating rate and aluminum content of the coating can be tailored to meet the particular requirements of the coating. Increasing the gas flow to the chamber results in greater amounts of unreacted aluminum being "swept" out of the chamber through an exhaust port, effectively lowering the aluminum activity of the coating process. In contrast, reducing the gas flow allows a greater amount of unreacted aluminum to remain in the chamber, effectively increasing the aluminum activity of the process. Conventional coating conditions can otherwise be used and maintained in the chamber, including the use of conventional coating materials, coating temperatures of about 950° C. to about 1150° C., and coating durations of about two to about ten hours.

To implement this invention, the highest desired aluminum activity for the coating process is established by the choice of source material and activator(s) used for the coating process, and the effective aluminum activity at any given time is controlled by metering the gas flow into the chamber. For example, the use of a source material with a minimum aluminum content of 25 weight percent and the use of aluminum fluoride as the activator provides for a relatively high aluminum activity, which can be effectively reduced by flowing argon gas through the chamber at a minimum rate of 10 SCFH (about 0.283 $m^3$/hr).

An application that benefits from the method of this invention is where minimized coating growth potential is desired during engine service on a component. To minimize in-service coating growth, an outward-type aluminide coating is preferred where nickel diffusion during coating formation is such to minimize interdiffusion of aluminum from the coating and nickel from the substrate (i.e., coating growth) during subsequent exposure to elevated temperatures. However, a high aluminum content is desired at the surface of the coating to promote environmental resistance. In this situation, source materials and one or more activators are selected to achieve a high maximum aluminum activity during coating. During coating, a relatively high gas flow (e.g., about 20 SCFH (about 0.57 $m^3$/hr)) is selected to effectively lower the aluminum activity such that the desired outward-type coating structure is formed during the majority of the coating run. The gas flow rate is then reduced or even eliminated toward the end of the coating run to increase aluminum activity and cause the external surface of the coating to be enriched in aluminum.

In another application for this invention, components such as turbine airfoils are repaired when returned from service, an example of which is the weld repair of a blade tip. The new metal at the blade tip requires a full coating to meet the minimum coating thickness established for the blade. However, those surface regions of the blade that were not repaired may still have all or part of the original aluminide coating, and therefore would likely exceed the maximum thickness allowed if subjected to the same coating conditions as the uncoated regions. With this invention, gas flow into the coating chamber is tailored to promote coating growth on the bare metal surfaces of the blade, while minimizing coating growth on the coated surfaces.

During an investigation leading to this invention, turbine blades with surfaces coated and uncoated by diffusion aluminide and platinum aluminide coatings were processed using CrAl alloy as the source material and aluminum fluoride as the activator in a retort with a volume of about 1.13 $m^3$. Argon gas was flowed into the retort at rates of between 10 and 30 SCFH (about 0.3 to about 0.9 $m^3$/hr), while the blades were being coated by vapor phase aluminizing at about 1038 to 1080° C. over a period of about two to six hours. The aluminum activity within the retort was established by the aluminum source and activator, such that the diffusion of aluminum into the bare surfaces of the blades determined the maximum coating growth rate, while gas flow rate through the retort was adjusted to minimize coating growth on the coated regions of the blades. As a result, the final thicknesses of the aluminide coatings fell within the minimum and maximum limits established for the blades.

While the invention has been described in terms of a preferred embodiment, it is apparent that other forms could be adopted by one skilled in the art. For example, the composition of the aluminide coating could be other than those noted, and the method could be applied to a variety of components whose surfaces benefit from an aluminide coating. Accordingly, the scope of the invention is to be limited only by the following claims.

What is claimed is:

1. A process for forming a diffusion aluminide coating, the process comprising the steps of:

placing a substrate in a coating chamber;

providing within the coating chamber an aluminum-containing vapor having a substantially constant aluminum activity;

flowing an inert or reducing gas into and through the coating chamber; and producing a diffusion aluminide coating on the substrate by contacting the substrate with the aluminum-containing vapor to cause a portion of the aluminum-containing vapor to react with and deposit aluminum on the substrate while maintaining the substantially constant aluminum activity of the aluminum-containing vapor within the coating chamber, and while controlling the rate at which aluminum is deposited on the substrate by altering the flow rate of the gas through the coating chamber so that a portion of the unreacted aluminum-containing vapor is swept from the coating chamber by the gas, and so that greater amounts of the unreacted aluminum-containing vapor are swept from the coating chamber with higher gas flow rates.

2. A process according to claim 1, wherein the process is a vapor phase deposition process.

3. A process according to claim 2, wherein the vapor phase deposition process is performed at about 950° C. to about 1150° C. for a duration of two to ten hours.

4. A process according to claim 1, wherein the substrate is a superalloy.

5. A process according to claim wherein the substrate is a gas turbine engine component.

6. A process according to claim 1, wherein the gas flow rate through the coating chamber is decreased while the diffusion aluminide coating is produced, such that the diffusion aluminide coating has a higher aluminum content at an outer portion thereof than at an inner portion thereof.

7. A process according to claim wherein, prior to placing the substrate in the coating chamber, a first surface portion of the substrate has a diffusion aluminide coating and a second surface portion of the substrate is free of any diffusion aluminide coating wherein the substantially constant aluminum activity of the aluminum-containing vapor is sufficiently high to promote diffusion of aluminum into the substrate relative to deposition of aluminum on the substrate, with the result that aluminum diffuses into the second surface portion more rapidly than the first surface portion, and wherein the gas flow rate is sufficiently high to inhibit deposition of aluminum on the first surface portion of the substrate, so that when the process is terminated the first and second portions of the substrate have rejuvenated diffusion aluminide coatings of substantially equal thicknesses.

8. A process for forming a diffusion aluminide coating, the process comprising the steps of:

placing a superalloy substrate in a coating chamber;

providing within the coating chamber an aluminum halide vapor having a substantially constant aluminum activity;

flowing an inert gas into and through the coating chamber; and producing a diffusion aluminide coating on the substrate by vapor phase aluminizing, during which the substrate is contacted with the aluminum halide vapor to cause a portion of the aluminum halide vapor to react with and deposit aluminum on the substrate while maintaining the substantially constant aluminum activity of the aluminum halide vapor within the coating chamber, and while controlling the amount of unreacted aluminum halide vapor within the coating chamber to control the rate at which aluminum is deposited on the substrate and to control the aluminum content of the diffusion aluminide coating by altering the flow rate of the gas through the coating chamber so that a portion of the unreacted aluminum halide vapor is swept from the coating chamber by the gas, and so that greater amounts of unreacted aluminum halide vapor are swept from the coating chamber with higher gas flow rates.

9. A process according to claim 8, wherein the vapor phase aluminizing is performed at about 950° C. to about 1150° C. for a duration of two to ten hours.

10. A process according to claim 8, wherein the gas flow rate is from about 10 to about 30 SCFH.

11. A process according to claim 8, wherein the substrate is a gas turbine engine component.

12. A process according to claim 9, wherein the gas flow rate through the coating chamber is decreased while the diffusion aluminide coating is produced, such that the diffusion aluminide coating has a higher aluminum content at an outer portion thereof than at an inner portion thereof.

13. A process according to claim 8 wherein, prior to placing the substrate in the coating chamber, a first surface portion of the substrate has a diffusion aluminide coating and a second surface portion of the substrate is free of any diffusion aluminide coating, wherein the substantially constant aluminum activity of the aluminum halide vapor is sufficiently high to promote diffusion of aluminum into the substrate relative to deposition of aluminum on the substrate, with the result that aluminum diffuses into the second surface portion more rapidly than the first surface portion, and wherein the gas flow rate is sufficiently high to inhibit deposition of aluminum on the first surface portion of the substrate, so that when the process is terminated the first and second portions of the substrate have rejuvenated diffusion aluminide coatings of substantially equal thicknesses.

* * * * *